United States Patent
Gehring

(10) Patent No.: US 7,683,694 B2
(45) Date of Patent: Mar. 23, 2010

(54) LOW NOISE LOGARITHMIC DETECTOR

(75) Inventor: Mark R. Gehring, Portland, OR (US)

(73) Assignee: Quantance, Inc., San Mateo, CA (US)

( * ) Notice: Subject to any disclaimer, the term of this patent is extended or adjusted under 35 U.S.C. 154(b) by 41 days.

(21) Appl. No.: 11/686,324

(22) Filed: Mar. 14, 2007

(65) Prior Publication Data

US 2008/0225988 A1    Sep. 18, 2008

(51) Int. Cl.
*G06G 7/24* (2006.01)

(52) U.S. Cl. .................... 327/350; 327/352; 327/46

(58) Field of Classification Search ............. None
See application file for complete search history.

(56) References Cited

U.S. PATENT DOCUMENTS

| | | | |
|---|---|---|---|
| 4,604,532 A | 8/1986 | Gilbert | |
| 5,189,313 A * | 2/1993 | Garuts | 327/170 |
| 5,251,017 A * | 10/1993 | Riviere | 348/674 |
| 5,296,761 A | 3/1994 | Fotowat-Ahmady et al. | |
| 5,548,233 A * | 8/1996 | Susak | 327/66 |
| 6,144,244 A | 11/2000 | Gilbert | |
| 7,184,452 B2 * | 2/2007 | Moran | 372/38.02 |
| 7,199,658 B2 * | 4/2007 | Floyd et al. | 330/251 |
| 2006/0008096 A1 * | 1/2006 | Waller | 381/106 |
| 2008/0100375 A1 * | 5/2008 | Hisayasu et al. | 327/553 |

OTHER PUBLICATIONS

Robert G. Meyer; Low-Power Monolithic RF Peak Detector Analysis; IEEE Journal of Solid-State Circuits, vol. 30, No. 1; Jan. 1995; pp. 65-67.

* cited by examiner

*Primary Examiner*—Tuan Lam
*Assistant Examiner*—Hiep Nguyen
(74) *Attorney, Agent, or Firm*—Fenwick & West LLP

(57) ABSTRACT

A logarithmic detector circuit including a drive circuit to receive a modulated input signal and generate a buffered modulated signal, a signal shaping circuit coupled to the drive circuit and configured to shape a voltage range of the buffered modulated signal to generate a shaped modulated signal, and a detecting circuit to detect the shaped modulated signal to generate an output signal substantially proportional to a logarithm of an amplitude of the modulated input signal.

17 Claims, 4 Drawing Sheets

LOW NOISE LOGARITHMIC DETECTOR

BACKGROUND

This disclosure relates to logarithmic detector circuits and, in particular, to low noise logarithmic detector circuits.

A received signal strength indication (RSSI) circuit typically includes a logarithmic detector to provide an output that is a logarithm of the received signal amplitude. A single logarithmic detector circuit can be used; however, such a circuit may not be accurate over a desired dynamic range.

To compensate, the RSSI circuit can include tap points from multiple amplifier stages amplifying the received signal. The signals at the tap points are fed to logarithmic detectors, with each logarithmic detector receiving a larger signal than the last. The outputs of the logarithmic detectors are combined together into the output signal. As a result, the accurate range of an individual detector can be overlapped with the other detectors, providing an increased dynamic range over which the RSSI circuit has an accurate logarithmic output.

Unfortunately, in order to achieve the accurate performance over the wide dynamic range, multiple detectors and multiple amplifier stages are required. As the number of components increase, so does the noise of the RSSI circuit.

Accordingly, there remains a need for a low noise logarithmic detector circuit with accurate logarithmic output and adequate dynamic range.

SUMMARY

An embodiment includes a logarithmic detector circuit including a drive circuit to receive a modulated input signal and generate a buffered modulated signal, a signal shaping circuit coupled to the drive circuit and configured to shape a voltage range of the buffered modulated signal to generate a shaped modulated signal, and a detecting circuit to detect the shaped modulated signal to generate an output signal substantially proportional to a logarithm of an amplitude of the modulated input signal.

Another embodiment includes a method of operating a logarithmic detector circuit for detecting an amplitude of a modulated input signal. The method includes amplifying the modulated input signal into an buffered modulated signal, shaping the buffered modulated signal into a shaped modulated signal such that the shaped modulated signal is distorted relative to the modulated input signal, and detecting the shaped modulated signal to generate an output signal substantially proportional to a logarithm of the amplitude of the modulated input signal.

DETAILED DESCRIPTION

Figure 1:
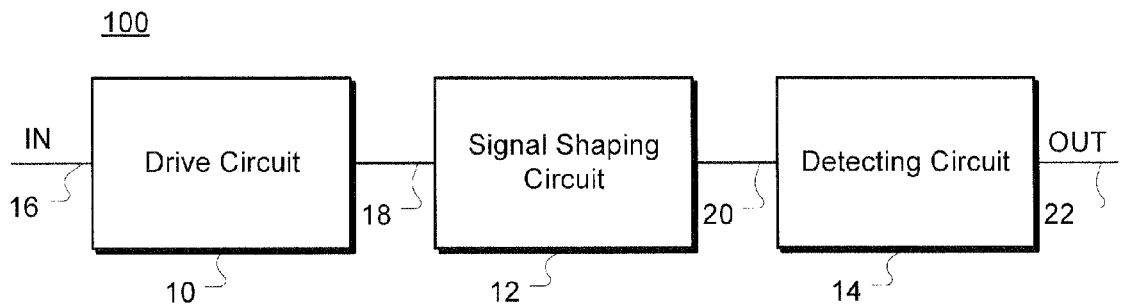
FIG. 1 is a block diagram of a logarithmic detector according to an embodiment.

FIG. 1 is a block diagram of a logarithmic detector 100 according to an embodiment. The logarithmic detector includes a drive circuit 10, a signal shaping circuit 12, and a detecting circuit 14.

The drive circuit 10 is configured to receive a modulated input signal 16 and generate a buffered modulated signal 18. The modulated input signal 16 can be any variety of modulated input signals. For example, the modulated input signal 16 can be an amplitude modulated signal, a phase modulated signal, a frequency modulated signal, a signal having a combination of such modulation formats, or the like.

The drive circuit 10 is configured to generate the buffered modulated signal 18 from the modulated input signal 16. Buffering the modulated input signal 16 can reduce the output impedance presented to the input to the signal shaping circuit 12. Buffering, as used in this description, can be, but need not be limited to creating a substantially similar version of the modulated input signal 16. Buffering can include limiting, shaping, or other changes to the modulated input signal 16.

The signal shaping circuit 12 is coupled to the drive circuit 10. The signal shaping circuit 12 is configured to shape a voltage range of the buffered modulated signal 18 to generate a shaped modulated signal 20. The detecting circuit 14 is configured to detect the shaped modulated signal 20 to generate an output signal 22, producing an output which is responsive to the amplitude of shaped modulated signal 20. Working together, the drive circuit 10 and the signal shaping circuit 12 can shape the buffered modulated signal 18 such that when the shaped modulated signal 20 is input to the detecting circuit 14, the resulting transfer function from the amplitude of the modulated input signal 16 to the output signal 22 is substantially proportional to a logarithm of an amplitude of the modulated input signal 16. Although the drive circuit 10 has been described as working together with the signal shaping circuit 12 to shape the buffered modulated signal 18, the drive circuit 10 can perform on shaping, leaving the shaping to the signal shaping circuit 12.

Figure 2:
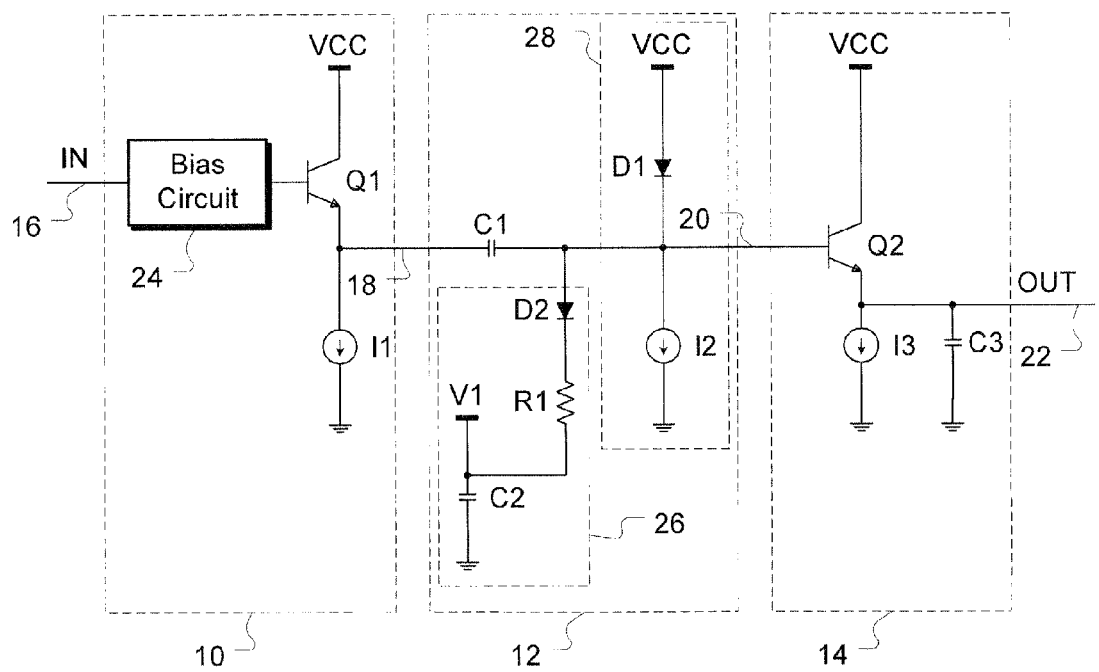
FIG. 2 is a schematic illustrating an example of a logarithmic detector of FIG. 1.

FIG. 2 is a schematic illustrating an example of a logarithmic detector 100 of FIG. 1. The drive circuit 10 includes a bias circuit 24, a transistor Q1, and a current source I1. In this example, the transistor Q1 is configured to receive the modulated input signal 16 and generate the buffered modulated signal 18.

The bias circuit 24 establishes an appropriate bias for the transistor Q1. In one embodiment, the bias circuit 24 is configured to control the base of the transistor Q1 such that the emitter is biased substantially in the middle between the power supply VCC and a ground. As a result, the buffered modulated signal 18 can maximize its swing at the emitter of the transistor Q1.

In this example, the transistor Q1 is configured as an emitter follower. The current source I1 is configured to bias the transistor Q1. Current source I1 can provide a function in addition to biasing the transistor Q1. In this example, transistor Q1 can pull up on the buffered modulated signal 18 with current from the power supply VCC. However, the drive circuit 10 as a whole can only pull down the buffered modulated signal 18 with current I1. That is, as the base of the transistor Q1 is pulled down, transistor Q1 turns off, leaving current source I1 to pull down the buffered modulated signal 18. As a result, the drive circuit 10 can have an asymmetrically shaped drive current to generate the buffered modulated signal 18, thus reducing the signal swing at the buffered modulated signal 18 when the amplitude of modulated input signal 16 is large.

Thus, an upper range of the output signal 22 is reduced relative to a corresponding upper range of modulated amplitude at the input signal, responsive to the drive circuit 10. The current source I1 can be selected to adjust the upper range of the transfer function such that the circuit has a more accurate representation of the logarithm of the amplitude of the modulated input signal 16 at higher amplitudes.

Although a single transistor Q1 has been described as part of the drive circuit 10, other transistors can be included. Such transistors would form a transistor circuit with the current source I1 as the bias to the transistor circuit. Furthermore, although an emitter follower has been described, any circuit that can present a reduced output impedance can be used in the drive circuit 10.

The signal shaping circuit 12 includes a first signal range shaper 26 and a second signal range limiter 28. The first signal range shaper 26 is configured to shape an upper end of the range of the buffered modulated signal 18. The second signal range shaper 28 is configured to shape a lower end of the range of the buffered modulated signal 18.

In this example, the first signal range shaper 26 includes the diode D2, the resistor R1, and the voltage source V1. The diode D2 is configured to receive the buffered modulated signal 18. The diode D2 is coupled to the voltage source V1 such that when the buffered modulated signal 18 through the capacitor C1 increases above V1, the diode D2 begins to conduct and consequently limits the voltage range of the buffered modulated signal 18 to generate the shaped modulated signal 20.

The shaping of the shaped modulated signal 20, in particular the limitation of the voltage range of the shaped modulated signal 20, has the effect of pre-distorting the input signal to the detecting circuit 14 such that a middle range of the transfer function of the output signal 22 versus the amplitude of the modulated input signal 16 can approach a logarithm of the amplitude of the modulated input signal 16 over a wider range.

The resistor R1 can affect the operation of the first signal range shaper 26. The resistor R1 is coupled in series with the diode. As a result, the resistor R1 affects the point at which the diode D2 begins to conduct. Furthermore, the resistor R1 also affects the degree of signal range limiting of the first signal range shaper 26. Such a degree of limiting can be referred to as soft limiting since a voltage is not clamped when the diode D2 is conducting, yet responds according to the resistor R1. As a result, the resistor R1 can influence the effect of the diode D2 on the middle range of the transfer function.

Similarly, the voltage source V1 affects the operation of the first limiter 26. The voltage source V1 can affect the point at which the diode D2 conducts, and hence limits the range of buffered modulated signal 18. Thus, voltage source V1 can influence the effect of the diode D2 on the middle range of the transfer function.

In an example, the voltage source V1 has a voltage that results in substantially zero current through the diode D2 at a quiescent point. Thus, in operation, the quiescent point of the shaped modulated signal 20 has a particular voltage. With the voltage source V1 set to that voltage, the diode D2 does not have a quiescent current. As a result, diode D2 does not substantially shape the buffered modulated signal 18 for small amplitudes.

Capacitor C2 is illustrated as coupled to the voltage source V1 and the resistor R1. Capacitor C2 is configured to reduce the output impedance of the voltage source V1 at higher frequencies. If the voltage source V1 has a large enough bandwidth, then capacitor C2 may not be needed.

The second signal range shaper 28 includes diode D1. Current source I2 provides a bias current for the diode D1. As a result, diode D1 is substantially forward-biased at a quiescent point. When the buffered modulated signal 18 increases, the bias of diode D1 is reduced, increasing its impedance. When the buffered modulated signal 18 decreases, the bias of diode D1 is increased, reducing its impedance and consequently reducing the downward excursion of the shaped modulated signal 20. Thus, diode D1 can shape the buffered modulated signal 18 to generate the shaped modulated signal 20.

One effect of the second signal range shaper 28 is to increase the sensitivity of the logarithmic detector circuit 100. As described above, swings of the buffered modulated signal 18 are asymmetrically affected. As a result, a DC voltage that increases with increasing amplitudes of the buffered modulated signal 18 is introduced into the shaped modulated signal 20. This DC voltage is combined in the detecting circuit 14 with the detected portion of the remainder of the amplitude of the shaped modulated signal 20. Thus, in this embodiment, the second signal range shaper 28 is configured to both detect a portion of the buffered modulated signal 18 to create a DC component, and pass a portion of the buffered modulated signal 18 to be detected in the detecting circuit 14. The addition of the DC voltage from the second signal range shaper 28 can increase the amplitude of the output signal 22, thus increasing the sensitivity of the logarithmic detector 100.

Although the second signal range shaper 28 has been described as operating in conjunction with the detecting circuit 14, the second signal range shaper 28 need not be included. In such an embodiment, the detecting circuit 14 can detect the amplitude of the shaped modulated signal 20 as generated by the signal shaping circuit 12.

The capacitor C1, as described above, can be the equivalent of a short circuit at operational frequencies such that the buffered modulated signal 18 and the shaped modulated signal 20 are substantially the same at those operational frequencies.

As described above, an upper and a middle range of the transfer function are reduced by components within the logarithmic detector 100. The lower range is more directly responsive to the amplitude of the modulated input signal 16. Thus, for example, a gain of an amplifier stage providing the modulated input signal 16 can adjust the lower range of the transfer function.

Furthermore, although an upper, middle, and lower range have been used to describe the influence of particular components and inputs of the logarithmic detector 100, such components and inputs need not be shaped to a particular range and can in fact influence the entire range or various portions. For example, the resistor R1 described above may have an effect on the upper range of the transfer function, although it has been described with reference to the middle range of the transfer function.

The detecting circuit 14 includes a transistor Q2, a capacitor C3, and a current source I3. The transistor Q2 has a base to receive the shaped modulated signal 20, and an emitter coupled to an output node. The capacitor C3 and the current source I3 are coupled to the output node. The detecting circuit 14 is configured to generate the output signal 22 on the output node.

In operation, as the shaped modulated signal 20 increases, the transistor Q2 increases the voltage on the capacitor C3, or the output signal 22. In this example, the change in the output signal 22 can be shaped by the emitter resistance and the capacitor C3. However, when the base of the transistor Q2 is pulled down as the shaped modulated signal 20 decreases, the base-emitter voltage can decrease below the voltage on the capacitor C3, turning off the transistor Q2 and leaving the current source I3 to discharge the capacitor C3. Thus, transistor Q2 can detect the shaped modulated signal 20 to generate the output signal 22, producing an output which is responsive to the amplitude of shaped modulated signal 20. Furthermore, through selection of the transistor Q2, the capacitor C3, and the current source I3, the bandwidth of the detecting circuit 14, and hence the bandwidth of the logarithmic detector circuit 100 can be selected.

Although the logarithmic detector 100 has been described as a single stage detector having advantages over a multi-detector design, the logarithmic detector 100 can be used in a multi-detector configuration. For example, multiple logarithmic detectors can be supplied with signals from multiple tap points of an amplifier chain. The output signals 22 of each logarithmic detector 100 can be combined with the other output signals 22. Through proper combination and gain selection of amplifier stages, a more accurate logarithmic response can be obtained.

Although bipolar transistors have been described above as components in the logarithmic detector 100, other transistor structures can be used, including a combination of transistor structures. For example, appropriate complementary metal-oxide semiconductor (CMOS) transistors can replace the bipolar transistors described above. In another example, a combination of bipolar and CMOS transistor structures can be used.

Figure 3:
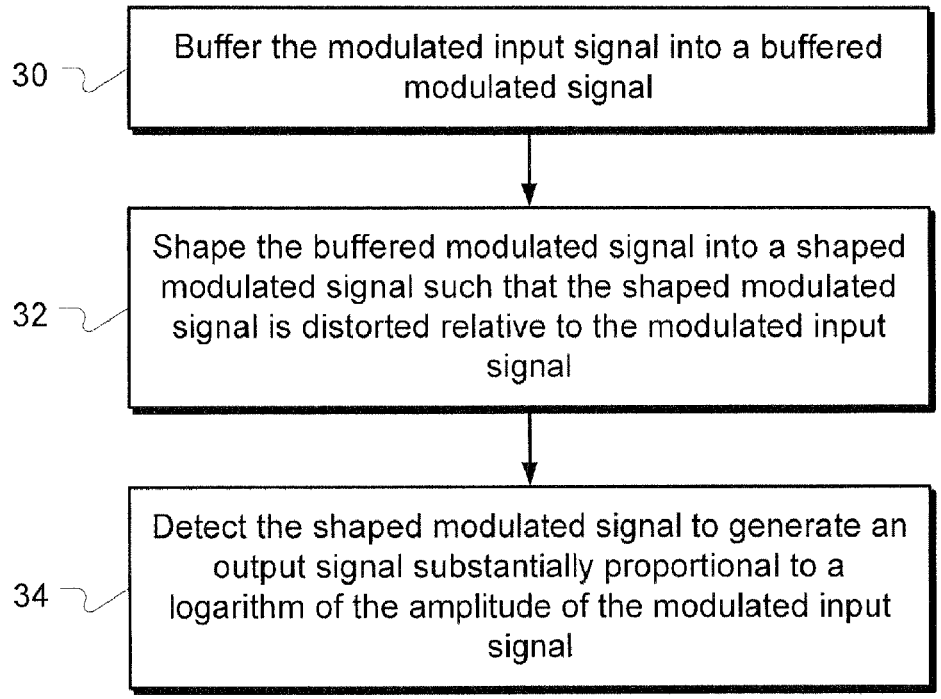
FIG. 3 is a flowchart showing how a logarithmic detector is operated according to an embodiment.

FIG. 3 is a flowchart showing how a logarithmic detector is operated according to an embodiment. A method of operating a logarithmic detector circuit for detecting an amplitude of a modulated input signal includes amplifying the modulated input signal into an buffered modulated signal in 30, shaping the buffered modulated signal into a shaped modulated signal such that the shaped modulated signal is distorted relative to the modulated input signal in 32, and detecting the shaped modulated signal to generate an output signal substantially proportional to a logarithm of the amplitude of the modulated input signal in 34.

The buffering of the modulated input signal into the buffered modulated signal in 30 includes any buffering that can provide a low output impedance for the buffered modulated signal. As described above, an emitter follower can provide such buffering.

The shaping of the buffered modulated signal into the shaped modulated signal in 32 includes any signal shaping that improves the accuracy of the logarithmic signal after detecting in 34. The improvement in the accuracy of the logarithmic signal after detection is a result of the distortion of the shaped modulated signal relative to the input signal. When the shaped modulated signal is detected in 34, the distortion's effect on the detection results in the improved accuracy.

The distortion that is introduced into the shaped modulated signal can be any variety of distortion depending on the detection in 34. For example, the shaped modulated signal can have portions that are larger in amplitude, smaller in amplitude, filtered, delayed, or the like relative to the modulated input signal. Limiting the signal range of the buffered modulated signal with diode circuits as described above is one example of shaping the buffered modulated signal to introduce the distortion. Such shaping results in a shaped modulated signal that is distorted relative to the modulated input signal, providing a closer approximation to a logarithm of the amplitude of the input modulated signal.

The detecting of the shaped modulated signal in 34 can include a variety of techniques. As described above, the amplification, shaping, and rectification can work in conjunction to shape the modulated input signal such that when it is detected, the resulting signal is a logarithmic representation of the modulated input signal.

Figure 4:
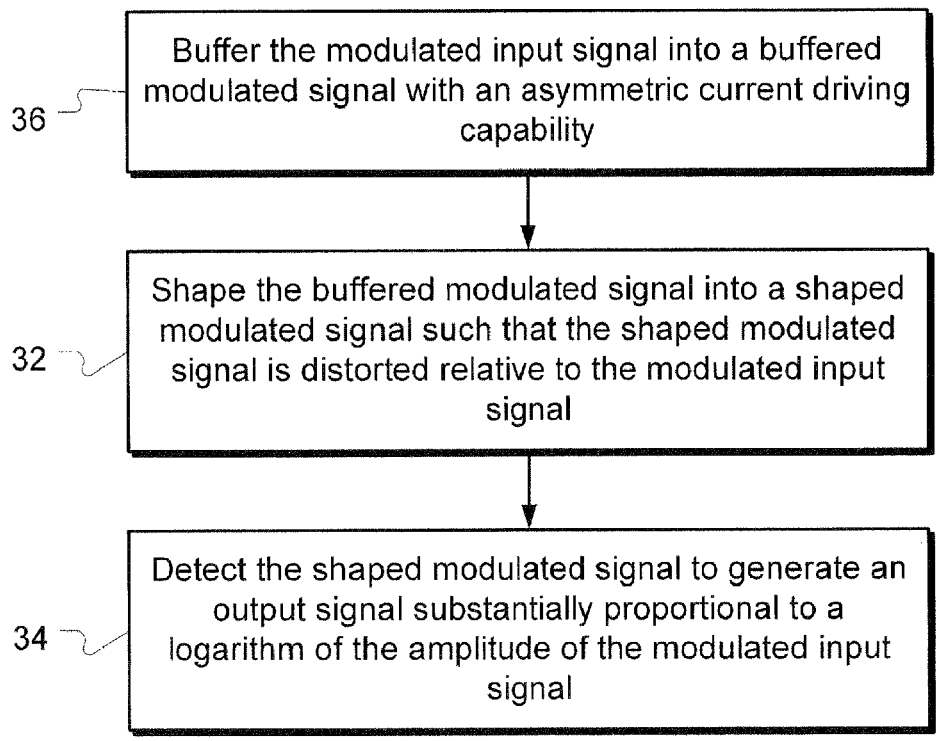
FIG. 4 is a flowchart showing an example of how a modulated input signal is buffered in the method of FIG. 3.

FIG. 4 is a flowchart showing an example of how a modulated input signal can be buffered in the method of FIG. 3. The method includes buffering the modulated input signal with an asymmetric current driving capability in 36. As described above, the asymmetrically shaped drive current generates the buffered modulated signal, thus reducing the signal swing at the buffered modulated signal when the amplitude of modulated input signal is large. Thus, an upper range of the output signal is reduced relative to a corresponding upper range of modulated amplitude at the input signal.

Figure 5:
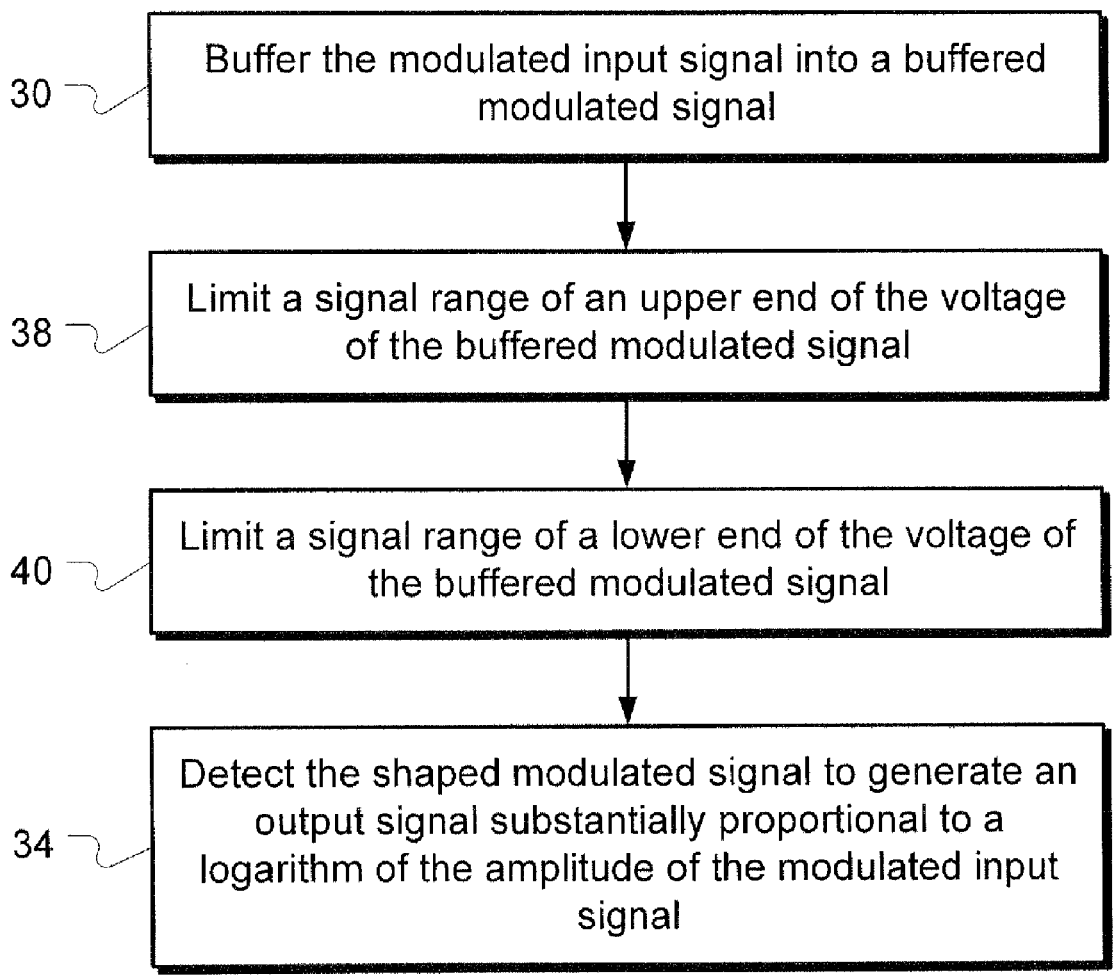
FIG. 5 is a flowchart showing an example of shaping an buffered modulated signal in FIG. 3.

FIG. 5 is a flowchart showing an example of shaping a buffered modulated signal in FIG. 3. The method includes limiting the signal range of an upper end of the voltage of the buffered modulated signal in 38, and limiting the signal range of a lower end of the voltage of the buffered modulated signal in 40. As described above, limiting the signal range is an example of shaping of the buffered modulated signal into the shaped modulated signal. Accordingly, a voltage range of the shaped modulated signal can me shaped on both an upper end and a lower end. The amount of limitation can, but need not be the same.

Figure 6:
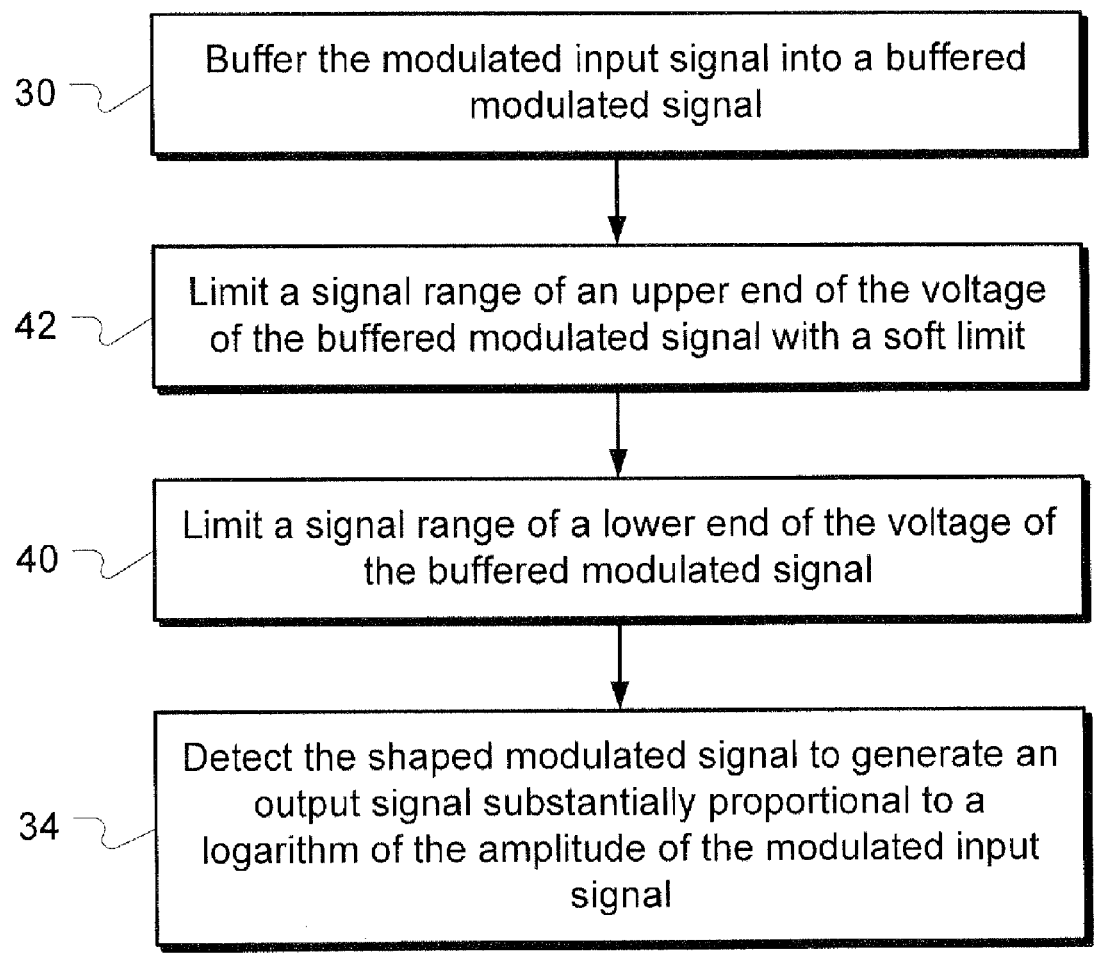
FIG. 6 is a flowchart showing an example of limiting an upper end of a voltage range in FIG. 5.

FIG. 6 is a flowchart showing an example of limiting the signal range of an upper end of a voltage in FIG. 6. The method includes limiting the signal range of the upper end of the voltage of the shaped modulated signal with a soft limit in 42. As described above, a soft limit can be used to shape the voltage range of the shaped modulated signal. Accordingly, the soft limit can be used to adjust the accuracy of the output signal.

Although the processes described above have been described in a particular sequence, such processes can be performed in various other sequences, parallel operations, or combinations of such sequences and parallel operations, whether occurring discretely or continuously, can be implemented.

Another embodiment includes a logarithmic detector circuit including means for buffering the modulated input signal into an buffered modulated signal, means for shaping the buffered modulated signal into a shaped modulated signal such that the shaped modulated signal is distorted relative to the modulated input signal, and means for detecting the shaped modulated signal to generate an output signal substantially proportional to a logarithm of the amplitude of the modulated input signal.

The means for buffering the modulated input signal into a buffered modulated signal include any circuitry capable of amplifying, buffering, or otherwise increasing the drive capability of a signal. The drive circuit described above is an example of the means for buffering.

The means for shaping the buffered modulated signal into a shaped modulated signal include any circuitry that can adjust the shape of a signal. In particular, the means for shaping includes any circuit that can improve the accuracy of the logarithmic detection of the modulation of the modulated input signal in the means for detecting. The signal shaping circuit described above is an example of the means for shaping.

The means for detecting the shaped modulated signal includes any non-linear circuitry that can be used to detect a signal. The detecting circuit described above is an example of the means for detecting.

In an embodiment, the means for buffering the modulated input signal has an asymmetrically shaped drive current to generate the buffered modulated signal. As described above, a current source or other circuit can shape an amount of drive current. Thus, the drive circuit described above with reference to FIG. 2 is an example of a means for buffering having an asymmetrically shaped drive current.

In an embodiment, the means for shaping the buffered modulated signal can include means for limiting the signal range of an upper end of the voltage of the shaped modulated signal, and means for limiting the signal range of a lower end of the voltage of the buffered modulated signal. Such means for shaping include any circuit capable of limiting the signal range of the voltage of the buffered modulated signal. The first and second signal range shapers described above are examples of such means for shaping.

In an embodiment, the means for limiting the signal range of the upper end of the voltage of the buffered modulated signal can include means for limiting the signal range of the upper end of the voltage of the buffered modulated signal with a soft limit. The introduction of a soft limit using the resistor R1 described above is an example of the means for limiting the voltage range of the buffered modulated signal with a soft limit.

Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

The invention claimed is:

1. A logarithmic detector circuit, comprising:
   a drive circuit to receive a modulated input signal and generate a buffered modulated signal;
   a signal shaping circuit coupled to the drive circuit and configured to shape a voltage range of the buffered modulated signal to generate a shaped modulated signal; and
   a detecting circuit to detect the shaped modulated signal to generate an output signal substantially proportional to a logarithm of an amplitude of the modulated input signal,
   wherein the signal shaping circuit comprises:
   a first signal range shaper to shape an upper end of the voltage range of the buffered modulated signal, the first signal range shaper including a first diode, an anode of the first diode being coupled to receive the buffered modulated signal, and the first diode being configured to limit the upper end of the voltage range of the buffered modulated signal not to exceed a predetermined voltage; and
   a second signal range shaper to shape a lower end of the voltage range of the buffered modulated signal, the second signal range shaper including a second diode, a cathode of the second diode being coupled to receive the buffered modulated signal, and the second diode being configured to limit the lower end of the voltage range of the buffered modulated signal.

2. The logarithmic detector circuit of claim 1, where:
   the drive circuit has an asymmetrically shaped drive current to generate the buffered modulated signal.

3. The logarithmic detector circuit of claim 1, where:
   the drive circuit is configured to reduce an upper range of the output signal relative to a corresponding upper range of modulated amplitude at the input signal.

4. The logarithmic detector circuit of claim 1, where the drive circuit comprises:
   a transistor circuit configured as an emitter follower to receive the modulated input signal and generate the buffered modulated signal; and
   a current source to bias the transistor circuit.

5. The logarithmic detector circuit of claim 1, wherein
   the first signal range shaper further includes a resistor coupled in series between a cathode of the first diode and the predetermined voltage; and
   the predetermined voltage is set to a value that results in the first diode having substantially zero current at a quiescent point.

6. The logarithmic detector circuit of claim 1, wherein
   the second signal range shaper further includes a current source coupled in series to the cathode of the second diode and providing bias current to the second diode;
   a bias of the second diode decreases as the buffered modulated signal increases, and the bias of the second diode increases as the buffered modulated signal decreases; and
   the second diode is substantially forward-biased at a quiescent point.

7. The logarithmic detector circuit of claim 1, wherein
   the first diode is configured to conduct when the buffered modulated signal increases above the predetermined voltage.

8. The logarithmic detector circuit of claim 5, where:
   a middle range of the output signal relative to a corresponding range of the amplitude of the modulated input signal is responsive to a resistance value of the resistor.

9. The logarithmic detector circuit of claim 5, wherein:
   a middle range of the output signal relative to a corresponding range of the amplitude of the modulated input signal is responsive to the predetermined voltage.

10. The logarithmic detector circuit of claim 1, the detecting circuit comprising:
    a transistor having a first terminal to receive the shaped modulated signal, and a second terminal coupled to an output node;
    a capacitor coupled to the output node; and
    a current source coupled to the output node;
    where the detecting circuit is configured to generate the output signal on the output node.

11. A method of operating a logarithmic detector circuit for detecting an amplitude of a modulated input signal, the method comprising:
    buffering the modulated input signal into a buffered modulated signal;
    shaping the buffered modulated signal into a shaped modulated signal such that the shaped modulated signal is distorted relative to the modulated input signal; and
    detecting the shaped modulated signal to generate an output signal substantially proportional to a logarithm of the amplitude of the modulated input signal, wherein shaping the buffered modulated signal into the shaped modulated signal comprises:
    limiting a signal range of an upper end of a voltage of the buffered modulated signal using a first diode coupled to receive the buffered modulated signal at an anode of the first diode such that the upper end of the voltage of the buffered modulated signal does not exceed a predetermined voltage; and
    limiting a signal range of a lower end of the voltage of the buffered modulated signal using a second diode coupled to receive the buffered modulated signal at a cathode of the second diode.

12. The method of claim 11, where buffering the modulated input signal comprises:

buffering the modulated input signal with an asymmetric current driving capability.

13. The method of claim 11, where limiting the signal range of the upper end of the voltage of the buffered modulated signal comprises:

limiting the signal range of the upper end of the voltage of the buffered modulated signal with a soft limit.

14. A logarithmic detector circuit, comprising:

a drive circuit to receive a modulated input signal and generate a buffered modulated signal;

a signal shaping circuit coupled to the drive circuit and configured to shape a voltage range of the buffered modulated signal to generate a shaped modulated signal; and a detecting circuit to detect the shaped modulated signal to generate an output signal substantially proportional to a logarithm of an amplitude of the modulated input signal, wherein the signal shaping circuit comprises:

a first signal range shaper to shape an upper end of the voltage range of the buffered modulated signal, the first signal range shaper including a first diode and a resistor coupled in series between a cathode of the first diode and a predetermined voltage, an anode of the first diode being coupled to receive the buffered modulated signal, and the first diode being configured to limit the upper end of the voltage range of the buffered modulated signal not to exceed the predetermined voltage; and a second signal range shaper to shape a lower end of the voltage range of the buffered modulated signal, the second signal range shaper including a second diode and a current source coupled in series to a cathode of the second diode and providing bias current to the second diode, a cathode of the second diode being coupled to receive the buffered modulated signal, and the second diode being configured to limit the lower end of the voltage range of the buffered modulated signal.

15. The logarithmic detector circuit of claim 14, wherein in the first signal range shaper the predetermined voltage is set to a value that results in the first diode having substantially zero current at a quiescent point.

16. The logarithmic detector circuit of claim 14, wherein in the second signal range shaper a bias of the second diode decreases as the buffered modulated signal increases, and the bias of the second diode increases as the buffered modulated signal decreases.

17. The logarithmic detector circuit of claim 14, wherein in the second signal range shaper the second diode is substantially forward-biased at a quiescent point.

* * * * *